United States Patent
Imai

(10) Patent No.: US 9,240,451 B2
(45) Date of Patent: Jan. 19, 2016

(54) SILICON CARBIDE SEMICONDUCTOR DEVICE

(71) Applicant: FUJI ELECTRIC CO., LTD., Kawasaki-shi (JP)

(72) Inventor: Fumikazu Imai, Tsukuba (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/485,572

(22) Filed: Sep. 12, 2014

(65) Prior Publication Data

US 2015/0001554 A1  Jan. 1, 2015

Related U.S. Application Data

(63) Continuation of application No. PCT/JP2013/057311, filed on Mar. 14, 2013.

(30) Foreign Application Priority Data

Mar. 30, 2012  (JP) ................. 2012-082444

(51) Int. Cl.
*H01L 27/095* (2006.01)
*H01L 29/47* (2006.01)
(Continued)

(52) U.S. Cl.
CPC ........ *H01L 29/1608* (2013.01); *H01L 21/0495* (2013.01); *H01L 29/0619* (2013.01);
(Continued)

(58) Field of Classification Search
CPC . H01L 29/1608; H01L 29/47; H01L 29/1095; H01L 29/0657; H01L 29/6606; H01L 29/66143; H01L 29/872; H01L 21/3043; H01L 21/3065; H01L 21/02529; H01L 21/0495; H01L 21/02609; H01L 21/28518; H01L 21/28537; H01L 21/2855
USPC ............ 257/471, 341, 343, 473, 476; 438/92, 438/167, 169, 176, 186, 212, 268, 570, 571, 438/573
See application file for complete search history.

(56) References Cited

U.S. PATENT DOCUMENTS

2004/0046202 A1* 3/2004 Nakayama et al. ........... 257/302
2006/0118812 A1   6/2006 Ohtsuka et al.
(Continued)

FOREIGN PATENT DOCUMENTS

JP  2000-036607 A   2/2000
JP  2005-277240 A  10/2005
(Continued)

*Primary Examiner* — Hsien Ming Lee
(74) *Attorney, Agent, or Firm* — Rabin & Berdo, P.C.

(57) ABSTRACT

A silicon carbide semiconductor device includes a low-concentration n-type drift layer deposited on a silicon carbide substrate to form a semiconductor substrate. A first front surface metal layer, which forms a Schottky contact with the semiconductor substrate, is formed on a front surface of the semiconductor substrate. An outer circumferential end of the first front surface metal layer extends on an interlayer insulating film which covers an edge portion. A second front surface metal layer which forms a front surface electrode is formed on the first front surface metal layer. When a portion of the second front surface metal layer is formed by dry etching, the entire first front surface metal layer, which will be Schottky contact metal, is covered with the second front surface metal layer. Thus, generation of an etching residue is prevented and a device with a front surface electrode structure with high reliability is provided.

12 Claims, 9 Drawing Sheets

(51) Int. Cl.
*H01L 21/00* (2006.01)
*H01L 21/338* (2006.01)
*H01L 29/16* (2006.01)
*H01L 29/872* (2006.01)
*H01L 29/66* (2006.01)
*H01L 29/06* (2006.01)
*H01L 21/04* (2006.01)
*H01L 29/40* (2006.01)
*H01L 29/45* (2006.01)
*H01L 29/04* (2006.01)

(52) U.S. Cl.
CPC ............ *H01L29/47* (2013.01); *H01L 29/6606* (2013.01); *H01L 29/66227* (2013.01); *H01L 29/872* (2013.01); *H01L 29/045* (2013.01); *H01L 29/401* (2013.01); *H01L 29/45* (2013.01)

(56) References Cited

U.S. PATENT DOCUMENTS

| | | | |
|---|---|---|---|
| 2007/0138482 A1 | 6/2007 | Tanimoto | |
| 2009/0134405 A1 | 5/2009 | Ota et al. | |
| 2011/0018005 A1* | 1/2011 | Nakano | 257/77 |
| 2011/0266558 A1 | 11/2011 | Yano | |

FOREIGN PATENT DOCUMENTS

| | | |
|---|---|---|
| JP | 2006-165225 A | 6/2006 |
| JP | 2007-184571 A | 7/2007 |
| JP | 2008-135611 A | 6/2008 |
| JP | 2009-094433 A | 4/2009 |
| JP | 2009-130266 A | 6/2009 |
| JP | 2010-086999 A | 4/2010 |
| JP | 2010-165838 A | 7/2010 |

* cited by examiner

SILICON CARBIDE SEMICONDUCTOR DEVICE

CROSS-REFERENCE TO RELATED APPLICATION(S)

This non-provisional application is a continuation of and claims the benefit of the priority of Applicant's earlier filed International Application No. PCT/JP2013/057311 filed Mar. 14, 2013, the entire contents of which are incorporated herein by reference.

BACKGROUND OF THE INVENTION

1. Field of the Invention

The present invention relates to a semiconductor device using silicon carbide, and more particularly, to a silicon carbide semiconductor device with a high-reliability front surface electrode structure which covers the entire Schottky contact metal of an edge portion with front surface electrode metal to prevent the generation of an etching residue.

2. Description of the Related Art

In the related art, semiconductor devices using silicon (Si) as a semiconductor material have been mainly used as power devices. However, silicon carbide (SiC) which is a wide band gap semiconductor has the following physical property values: thermal conductivity that is three times more than that of silicon; maximum electric field intensity that is ten times more than that of silicon; and an electron drift speed that is two times more than that of silicon. Therefore, in recent years, each institute has conducted research on the application of power devices which have a high breakdown voltage and low loss and can operate at a high temperature.

In a structure of such a power device, a vertical semiconductor device has been mainly used in which a rear surface electrode including a low-resistance ohmic electrode is provided on the rear surface side of a substrate. The rear surface electrode is made of various materials and has various structures. As an example of the structures, for example, a laminate of a titanium (Ti) layer, a nickel (Ni) layer, and a silver (Ag) layer, for example, see JP 2007-184571 A (Patent Document 1), or a laminate of a titanium layer, a nickel layer, and a gold (Au) layer, for example, see JP 2010-86999 A (Patent Document 2), has been proposed.

In a vertical semiconductor device using SiC which is typified by a Schottky barrier diode, the following device has been proposed. For example, an n-type drift layer with low impurity concentration is deposited on one main surface of a SiC substrate having a (0001) plane as the main surface. The n-type drift layer includes a region A with a structure in which only a first conductivity type region is provided or a structure in which the first conductivity type region and a second conductivity type region are periodically provided, a region B of the second conductivity type which surrounds the region A, and a region C of the second conductivity type which surrounds the region B and has a different impurity concentration from the region B. In the front surface electrode, a metal layer which is made of aluminum (Al) or aluminum alloy is formed on a Schottky contact to form an electrode structure.

In addition, a method has been used which forms a nickel layer on the other main surface of a SiC substrate, heats the nickel layer to form a nickel silicide layer, and forms an ohmic contact between the SiC substrate and the nickel silicide layer, for example, see JP 2007-184571 A (Patent Document 1) and JP 2010-86999 A (Patent Document 2). Furthermore, as a method for forming an ohmic electrode, a method has been proposed which forms a plurality of metal films on a SiC substrate and then performs a heating process at a temperature of 700° C. to 1100° C., more preferably, about 800° C. to obtain good ohmic characteristics, for example, see JP 2005-277240 A (Patent Document 3). Further, JP 2008-135611 A (Patent Document 4) discloses a technique which radiates a laser beam to form an ohmic electrode.

In a process for manufacturing a Schottky barrier diode according to the related art, the front surface electrode is formed by a so-called lift-off method which forms a metal film on a resist having a window portion formed therein and then removes the resist, for example, see JP 2010-165838 A (Patent Document 5). However, in the lift-off method, a burr is likely to be generated in a pattern edge portion, which causes an element defect. Therefore, the lift-off method is not preferable. It is preferable to pattern the metal layer using a dry etching method, instead of the lift-off method.

When the metal layer is patterned by the dry etching method, a residue which is generated during dry etching is attached to a portion of the metal layer and the Schottky contact which is not covered with the metal layer is exposed to plasma and is damaged, which is likely to cause an element defect.

The invention has been made in order to solve the problems of the related art and an object of the invention is to provide a silicon carbide semiconductor device which does not cause an element defect and has high quality.

SUMMARY OF THE INVENTION

The inventor conducted intensive research in order to achieve the object and found that a high-quality silicon carbide semiconductor device was obtained by covering the entire Schottky contact with a metal layer made of an aluminum or aluminum alloy.

The invention has been conceived on the basis of the findings and provides the following.

In order to solve the above-mentioned problems and achieve the object of the invention, a silicon carbide semiconductor device according to an aspect of the invention has the following characteristics. A silicon carbide semiconductor substrate includes a first region that has a structure in which a first-conductivity-type region is provided or a structure in which the first-conductivity-type region and a second-conductivity-type region are periodically provided, a second region which surrounds the first region and in which a second-conductivity-type region is provided, a third region which surrounds the second region and in which a second-conductivity-type region having a different impurity concentration from the second-conductivity-type region of the second region is provided, and an interlayer insulating film which is formed on the second region and the third region. A first metal layer that covers at least the first region and a second metal layer that is formed on the first metal layer are formed on the silicon carbide semiconductor substrate. Dry etching is performed on a portion of the second metal layer and the second metal layer covers the entire first metal layer.

In the silicon carbide semiconductor device according to the above-mentioned aspect of the invention, the first metal layer may be a film including at least one of a titanium film, a titanium alloy film, a nickel film, a nickel alloy film, or a nickel-titanium alloy film. The second metal layer may be an aluminum film or an aluminum alloy film.

In the silicon carbide semiconductor device according to the above-mentioned aspect of the invention, the first metal layer may have a thickness of 20 nm to 200 nm.

In the silicon carbide semiconductor device according to the above-mentioned aspect of the invention, an outer circumferential end of the first metal layer and an outer circumferential end of the second metal layer may be provided in the second region.

In the silicon carbide semiconductor device according to the above-mentioned aspect of the invention, an interface between the first region and the first metal layer may form a Schottky contact.

According to the invention, it is possible to provide a method for manufacturing a front surface electrode for a high-quality semiconductor device in which an etching residue is not generated when the front surface electrode is formed and a method for manufacturing a semiconductor device that includes the front surface electrode for a semiconductor device and has excellent characteristics.

BRIEF DESCRIPTION OF DRAWINGS

FIG. 2-1 is a cross-sectional view illustrating a process for manufacturing a Schottky barrier diode;

FIG. 2-2 is a cross-sectional view illustrating the process for manufacturing the Schottky barrier diode;

FIG. 2-3 is a cross-sectional view illustrating the process for manufacturing the Schottky barrier diode;

FIG. 2-4 is a cross-sectional view illustrating the process for manufacturing the Schottky barrier diode;

FIG. 2-5 is a cross-sectional view illustrating the process for manufacturing the Schottky barrier diode;

FIG. 2-6 is a cross-sectional view illustrating the process for manufacturing the Schottky barrier diode;

FIG. 2-7 is a cross-sectional view illustrating the process for manufacturing the Schottky barrier diode;

FIG. 3 is a cross-sectional view illustrating the structure of an edge portion in a process for manufacturing a Schottky barrier diode according to the related art; and FIG. 4 is a cross-sectional view illustrating the structure of an edge portion in a process for manufacturing a Schottky barrier diode according to the invention.

DETAILED DESCRIPTION OF THE INVENTION

A semiconductor device according to the invention includes a semiconductor substrate including a first region A, a second region B that surrounds the first region A, and a third region C that surrounds the second region B. The first region A has a structure in which only a first-conductivity-type region is provided or a structure in which the first-conductivity-type region and a second-conductivity-type region are periodically provided. The first region A is surrounded by the second region B and the third region C. A second-conductivity-type region is provided in the second region B. A second-conductivity-type region having a different impurity concentration from the second-conductivity-type region of the second region B is provided in the third region C. An interlayer insulating film is provided on the second region B and the third region C in a front surface of the semiconductor substrate. In addition, a first metal deposition film that covers at least the first region A and a second metal deposition film that is formed on the first metal deposition film are provided on the front surface of the semiconductor substrate. In the semiconductor device, dry etching is performed on a portion of the second metal deposition film and the second metal deposition film completely covers the first metal deposition film.

Figure 1:
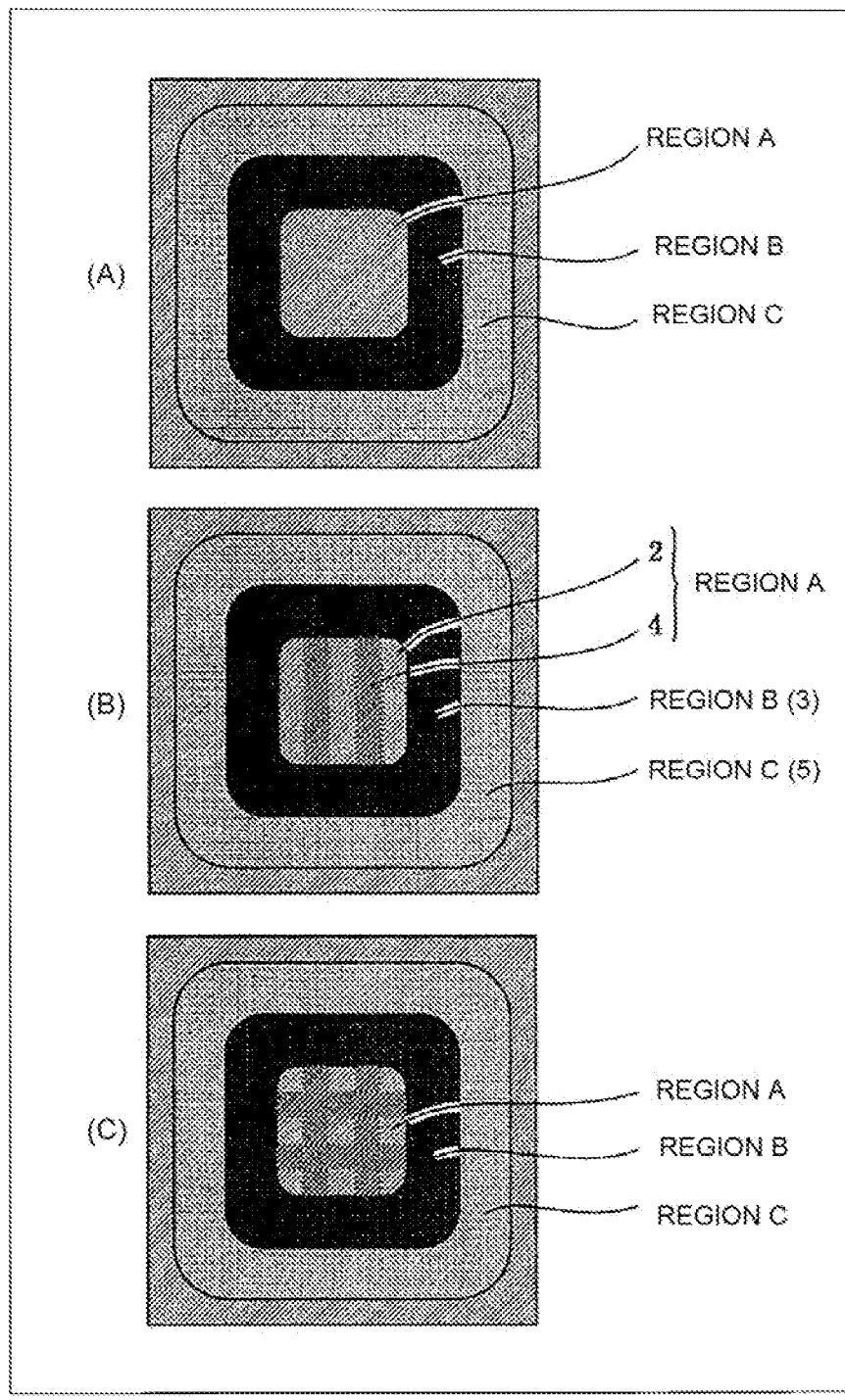
FIG. 1 is a diagram illustrating examples of regions A to C according to the invention.

Hereinafter, preferred embodiments of the invention will be described in detail with reference to the accompanying drawings. In the description of the following embodiments and the accompanying drawings, the same components are denoted by the same reference numerals and the description thereof will not be repeated. In the specification, in the notation of a Millers index, "-" means a bar which is attached to an index immediately after the symbol and "-" which is attached before the index indicates a negative index. FIG. 1 is a diagram illustrating examples of the first to third regions A to C according to the invention. As illustrated in FIG. 1, in the semiconductor device according to the invention, the semiconductor substrate includes the first region A, the second region B that surrounds the first region A, and the third region C that surrounds the second region B. The first region A has the structure in which only the first-conductivity-type region is provided or the structure in which the first-conductivity-type region and the second-conductivity-type region are periodically provided. The first region A is surrounded by the second region B including the second-conductivity-type region and the third region C including the second-conductivity-type region that has a different impurity concentration from the second-conductivity-type region of the second region B. FIG. 1(*a*) illustrates an example in which only the first-conductivity-type region is provided in the first region A and FIGS. 1(*b*) and 1(*c*) illustrate an example in which the first-conductivity-type region and the second-conductivity-type region are periodically provided in the first region A. In the invention, in the first region A, the first-conductivity-type region and the second-conductivity-type region may be periodically arranged. For example, the first-conductivity-type region and the second-conductivity-type region may be arranged in a stripe shape that extends in a direction perpendicular to the direction in which the first-conductivity-type region and the second-conductivity-type region are arranged in a line, as illustrated in FIG. 1(*b*). Alternatively, the first-conductivity-type region (or the second-conductivity-type region) may be arranged in a lattice and the second-conductivity-type region (or the first-conductivity-type region) may be arranged in a matrix by the lattice-shaped first-conductivity-type region, as illustrated in FIG. 1(*c*). Hereinafter, the semiconductor device according to the invention will be described on the basis of a process for manufacturing the semiconductor device.

First Embodiment:

FIGS. 2-1 to 2-7 are cross-sectional views illustrating a process for manufacturing a Schottky barrier diode. FIGS. 2-1 to 2-7 illustrate a process for manufacturing a silicon carbide semiconductor device according to a first embodiment of the invention. A method for manufacturing the silicon carbide semiconductor device according to the first embodiment is performed as follows.

Figures 1, 2:
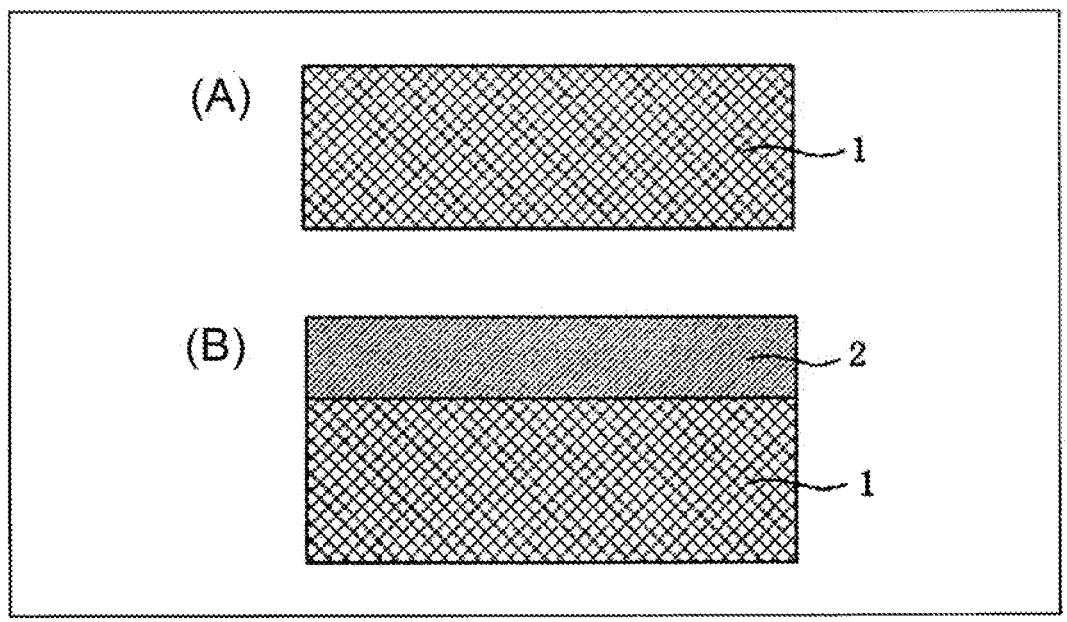
Figure 2:
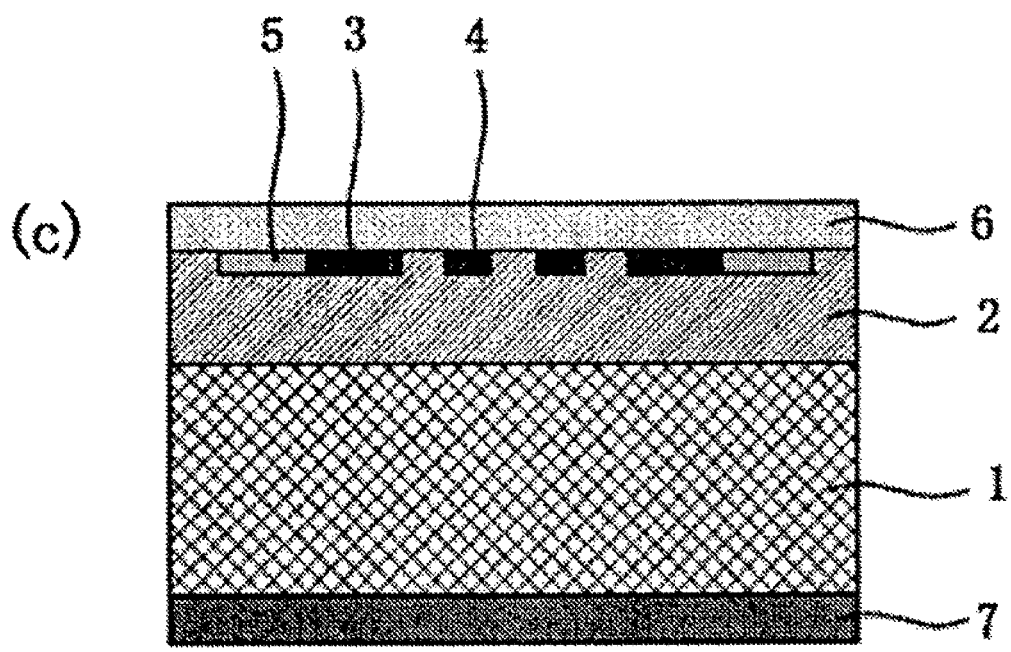

First, as illustrated in (a) of FIG. 2-1, a high-concentration n-type substrate (silicon carbide substrate 1) which is doped with nitrogen at, for example, $5 \times 10^{18}$ cm$^{-3}$, has a thickness of 350 µm, and has a (0001) plane as a main surface is prepared. Then, as illustrated in (b) of FIG. 2-1, a low-concentration n-type drift layer 2 which is doped with nitrogen at, for example, $1.0 \times 10^{16}$ cm$^{-3}$ and has a thickness of 10 µm is deposited on one main surface of the silicon carbide substrate 1. Therefore, a semiconductor substrate having the low-concentration n-type drift layer 2 deposited on the silicon carbide substrate 1 is formed. Hereinafter, a surface of the semiconductor substrate close to the low-concentration n-type drift layer 2 is referred to as a front surface and a surface of the semiconductor substrate close to the silicon carbide substrate 1 (the other main surface of the silicon carbide substrate 1) is referred to as a rear surface.

Then, as illustrated in FIG. 2-2, aluminum ions are implanted into the front surface of the substrate by, for example, an ion implantation apparatus in order to selectively form a p-type region 3 for a termination structure, a p-type region 4 for a junction barrier Schottky (JBS) structure, and a p-type region 5 for a junction termination extension (JTE) structure in a surface layer of the low-concentration n-type drift layer 2 (a surface layer opposite to the silicon carbide substrate 1). Then, a thermal activation process is performed in, for example, an argon (Ar) atmosphere at a temperature of 1650° C. for 240 seconds in order to activate the aluminum ions which are implanted in order to form the p-type region 3 for a termination structure, the p-type region 4 for a JBS structure, and the p-type region 5 for a JTE structure. In the first embodiment illustrated in FIG. 2-2, the first to third regions A to C have the structure illustrated in FIG. 1(b). Specifically, the first region A includes the low-concentration n-type drift layer 2 and the p-type region 4 for a JBS structure which is formed by ion implantation and has the structure in which the low-concentration n-type drift layer 2 and the p-type region 4 for a JBS structure are periodically arranged. The second region B includes the p-type region 3 for a termination structure. The third region C includes the p-type region 5 for a JTE structure.

Then, a thermally-oxidized layer with a thickness of, for example, 50 nm is formed on the front surface of the semiconductor substrate (on the low-concentration n-type drift layer 2) to remove a contamination layer which is formed on the front surface of the substrate by the activation. Then, for example, an interlayer insulating film 6 with a thickness of 0.5 μm is formed on the surface of the low-concentration n-type drift layer 2.

As illustrated in FIG. 2-2, for example, a nickel (Ni) layer with a thickness of 50 nm and a titanium (Ti) layer with a thickness of 10 nm are deposited as a first rear surface metal layer 7 on the other main surface (rear surface) of the silicon carbide substrate 1. Then, a heat treatment is performed using, for example, a rapid thermal annealing (RTA) apparatus. Specifically, the heat treatment may be performed under the conditions of, for example, a rate of temperature increase of 1° C./second and a duration of two minutes at a temperature of 1050° C. or more, for example, 1100° C. Therefore, the first rear surface metal layer 7 illustrated in FIG. 2-2 is silicidized and changed to a first rear surface metal layer 8, as illustrated in FIG. 2-3 and an ohmic contact 9 with low resistance is formed between the other main surface of the silicon carbide substrate 1 and the first rear surface metal layer 8.

In addition, Ti in the Ti layer, Ni in the Ni layer, and silicon (Si) and carbon (C) in the silicon carbide substrate 1 react with each other by the heat treatment to form a layer 10, which is made of a material, such as Ti silicide (TiSi), Ni silicide (NiSi), Ti carbide (TiC), a 3-element compound of Ti, Si, and carbon (TixSiyCz), or combinations thereof having high adhesion to other metal materials, on the surface of the first rear surface metal layer 8. In addition, in some cases, carbon which does not react remains on the surface of the first rear surface metal layer 8 subjected to the heat treatment (that is, the surface of the layer 10 with high adhesion to other metal materials), depending on the conditions such as a low heat treatment temperature, which is not illustrated.

The subsequent processes are not illustrated in the drawings. However, for example, when a vertical Schottky barrier diode (SBD) is manufactured, a large number of processes are performed in order to manufacture a structure, such as a Schottky contact, on a surface (the front surface of the substrate) opposite to the surface subjected to the process according to the invention. Then, for example, as illustrated in FIG. 2-4, a Ti film is formed as a first front surface metal layer 11 having a Schottky junction with the low-concentration n-type drift layer 2 and the temperature increases at a rate of temperature increase of 8° C./second and is maintained at 500° C. for 5 minutes to form the Schottky junction. Then, an Al—Si film with a thickness of, for example, 5 μm is formed as a second front surface metal layer 12, which will be a bonding electrode pad, and polyimide 13 is formed on the interlayer insulating film 6.

Figures 2, 3:
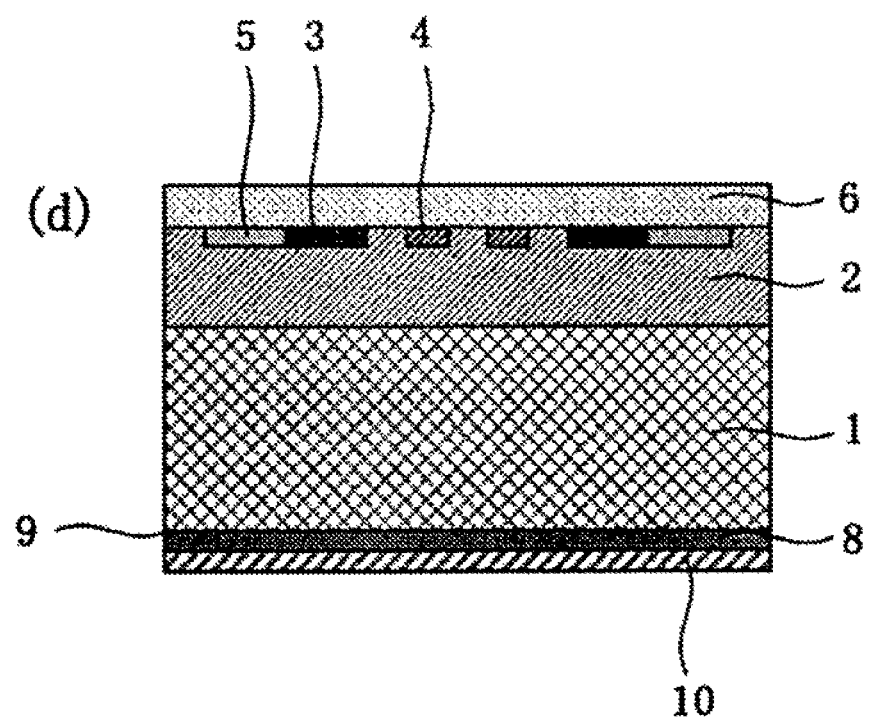
Figures 2, 3, 4:
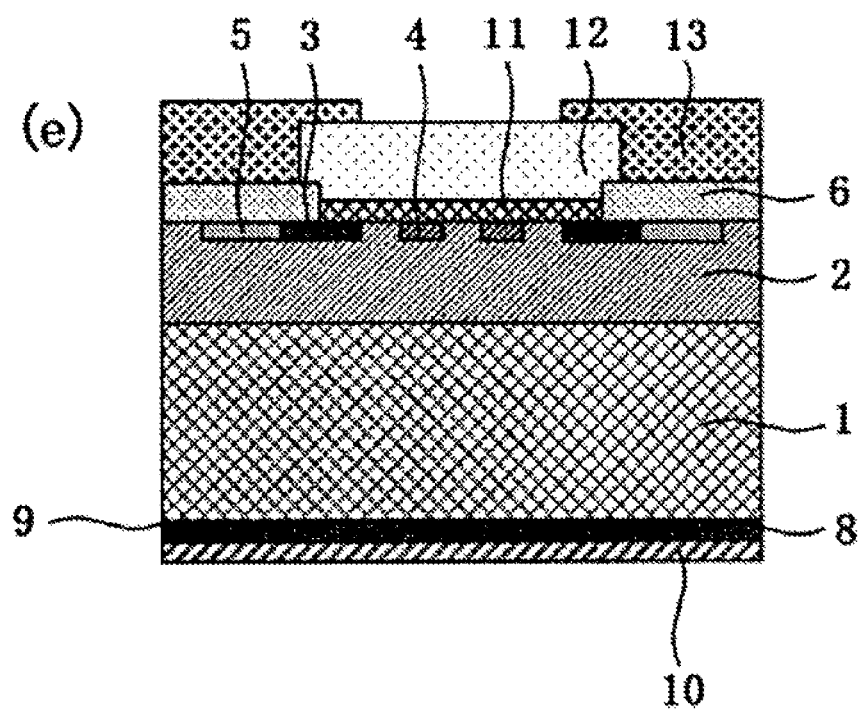
Figures 2, 3, 4, 5:
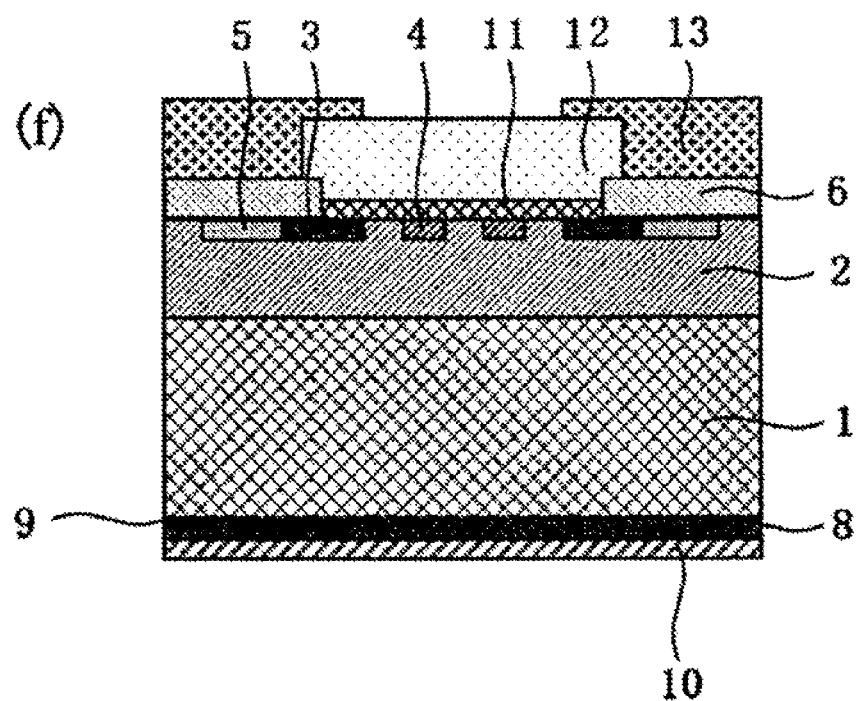
Figures 2, 3, 4, 5, 6:
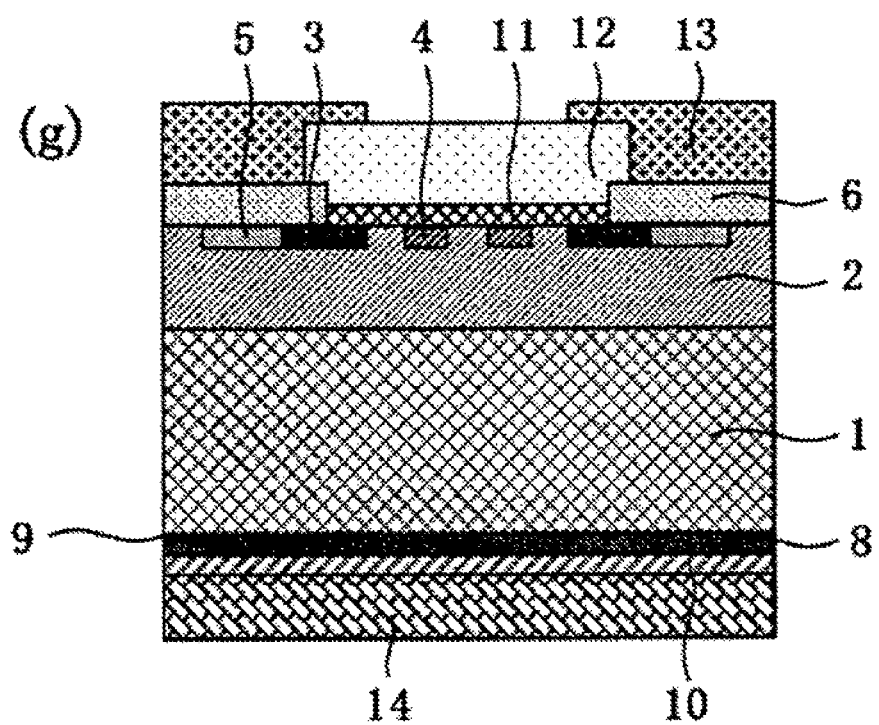
Figures 2, 3, 4, 5, 6, 7:
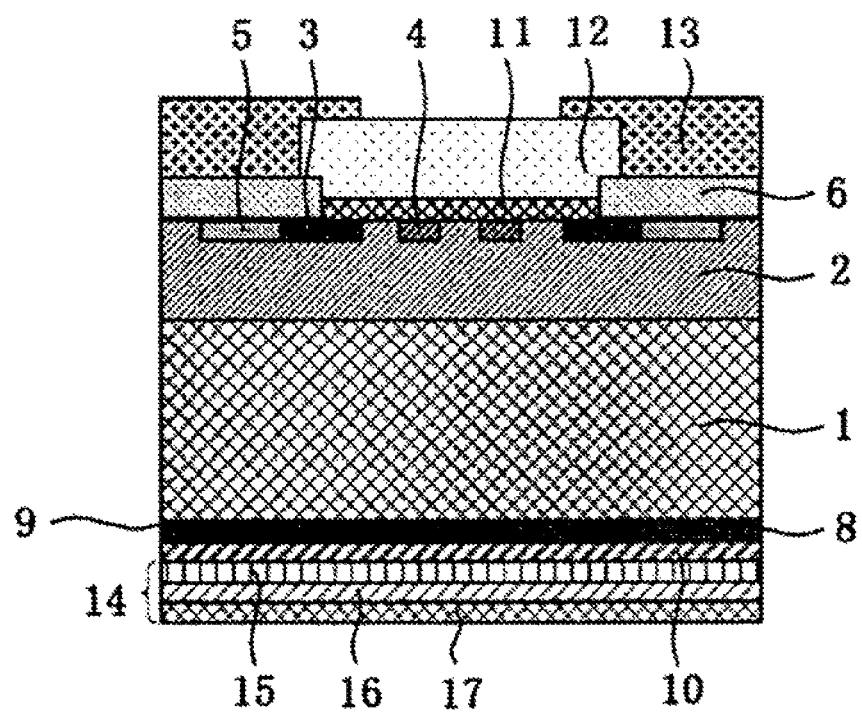
Figure 3:
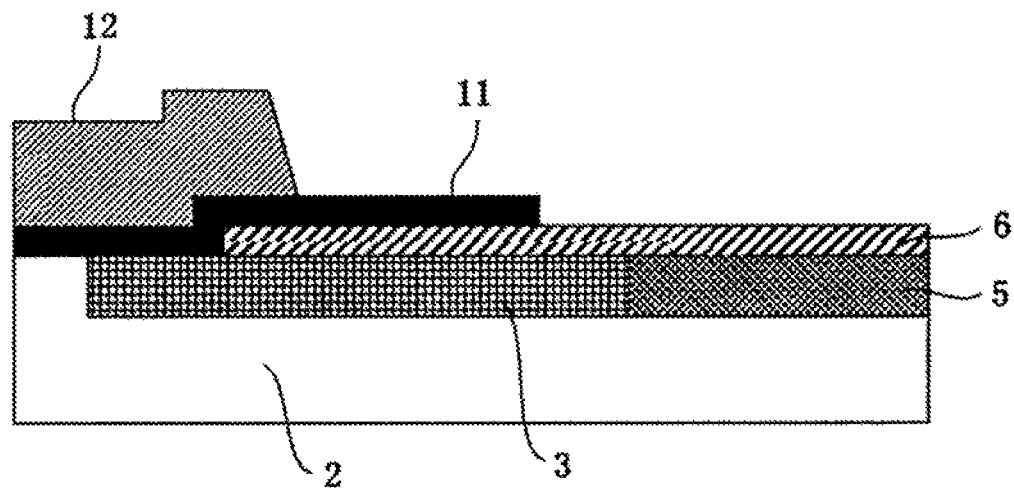
Figure 4:
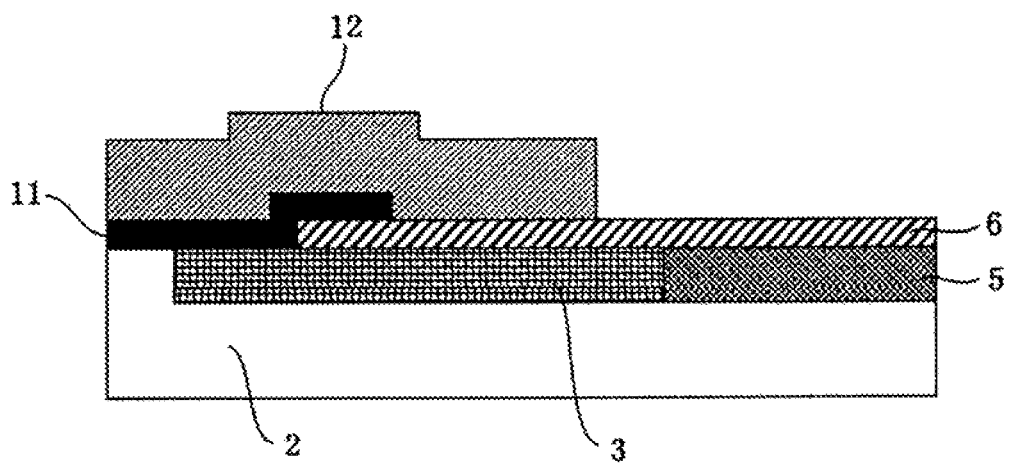

In the schematic diagram illustrated in FIG. 2-4, the outer circumferential end of the first front surface metal layer 11 is disposed on the p-type region 3 for a termination structure in an edge portion. In the invention, the first front surface metal layer 11 may be formed so as to cover at least the first region A (see FIG. 3 which will be described below) and an interface between the first region A and the first front surface metal layer 11 may form the Schottky contact. In addition, it is preferable that the thickness of the first front surface metal layer 11 be in the range of, for example, about 20 nm to 200 nm. The first front surface metal layer 11 may be a titanium alloy film, a nickel film, a nickel alloy film, or a nickel titanium alloy film, in addition to the Ti film. The second front surface metal layer 12 may be an aluminum film or other aluminum alloy films, in addition to the Al—Si film.

Then, for example, the rear surface of the substrate is processed by a reverse sputtering method which collides ionized argon (Ar) to remove impurities, thereby cleaning the surface. Therefore, carbon which remains without reaction or a residue is removed and the layer 10 which is made of the material with high adhesion to other metal materials appears on the rear surface of the rear surface of the substrate, as illustrated in FIG. 2-5. Immediately after the rear surface of the substrate is processed, a second rear surface metal layer 14 is formed, with the layer 10, which is made of the material with high adhesion to other metal materials, being exposed from the rear surface of the substrate, as illustrated in FIG. 2-6. For example, the second rear surface metal layer 14 which does not peel off and has low resistance is formed by forming a Ti film 15 with a thickness of, for example, 100 nm, a Ni film 16 with a thickness of, for example, 500 nm, and an Au film 17 with a thickness of, for example, 200 nm on the surface of the layer 10 which is made of the material with high adhesion to other metal materials in a vacuum using a vapor deposition apparatus, as illustrated in FIG. 2-7. The second rear surface metal layer 14 is connected to, for example, an external device.

FIG. 3 is a cross-sectional view illustrating the structure of an edge portion in a process for manufacturing a Schottky barrier diode according to the related art. The first front surface metal layer 11 is formed in a window portion of the interlayer insulating film 6 having the window portion formed therein. However, it is very difficult to completely align the outer circumferential end of the first front surface metal layer 11 with the inner end (end close to the first region A) of the interlayer insulating film 6 such that a silicon portion is not exposed between the first front surface metal layer 11 and the interlayer insulating film 6. Therefore, in general, as illustrated in FIG. 3, the outer circumferential end of the first front surface metal layer 11 extends onto the interlayer insulating film 6 which is formed on the p-type region 3 for a termination structure. The second front surface metal layer 12 is formed on the first front surface metal layer 11. The outer circumferential end of the second front surface metal layer 12 is disposed inside the outer circumferential end of the first front surface metal layer 11.

When the second front surface metal layer 12 is formed, a Schottky contact (first front surface metal layer 11) is patterned and the second front surface metal layer 12, which will be a front surface electrode, is formed on the entire front surface of the substrate, as illustrated in FIG. 3. Then, a resist layer is formed on the second front surface metal layer 12 and is patterned in a predetermined shape. Then, the second front surface metal layer 12 is patterned using the resist layer as a mask. Specifically, the second front surface metal layer 12 is patterned as follows. First, the second front surface metal layer 12 is immersed in a phosphoric/acetic/nitric acid solution which has an impurity concentration of 50% and a solution temperature of 60° C. for 5 minutes. Then, a dry etching process is performed in a dry etching apparatus under the conditions of, for example, 45 sccm of $CF_4$, 5 sccm of $O_2$, a pressure of 33 Pa, a bias power of 150 W, and a processing time of 30 seconds. At that time, an etching residue is generated and the Schottky contact is exposed to etching plasma and is damaged.

FIG. 4 is a cross-sectional view illustrating the structure of the edge portion in the process for manufacturing the Schottky barrier diode according to the invention. In FIG. 4, similarly to FIG. 3, the outer circumferential end of the first front surface metal layer 11 extends onto the interlayer insulating film 6 formed on the p-type region 3 for a termination structure in the edge portion. The second front surface metal layer 12 is formed on the first front surface metal layer 11. The first front surface metal layer 11 is covered with the second front surface metal layer 12. That is, in the structure according to the invention illustrated in FIG. 4, the entire Schottky contact (first front surface metal layer 11) is covered with the second front surface metal layer 12 which will be the front surface electrode. Therefore, when the second front surface metal layer 12 is patterned, it is possible to prevent the generation of an etching residue and to obtain an element with excellent characteristics, while preventing the damage of the first front surface metal layer 11 due to plasma. As illustrated in FIG. 4, in the invention, it is preferable that the outer circumferential ends of both the first front surface metal layer 11 and the second front surface metal layer 12 be arranged in the second region B having the second-conductivity-type region (the p-type region 3 for a termination structure) provided therein.

Second Embodiment:

In the first embodiment, the case in which the SBD device is manufactured has been described. However, other devices, for example, front surface structures, such as MOS gates (metal-oxide-semiconductor insulated gates), can be manufactured on the front surface side of the substrate. A silicon carbide semiconductor device according to a second embodiment has the same structure as the silicon carbide semiconductor device according to the first embodiment except for the front surface structure of the silicon carbide semiconductor device. Therefore, in a process for manufacturing the silicon carbide semiconductor device according to the second embodiment, the MOS gate may be formed, for example, when the front surface structure is formed in the process for manufacturing the silicon carbide semiconductor device according to the first embodiment.

Third Embodiment:

In the first embodiment, the (0001) plane is given as an example of the main surface of the silicon carbide substrate 1. However, a (000-1) plane may be used as the main surface of the silicon carbide substrate 1. A silicon carbide semiconductor device according to a third embodiment has the same structure as the silicon carbide semiconductor device according to the first embodiment except for the silicon carbide substrate 1. Therefore, a process for manufacturing the silicon carbide semiconductor device according to the third embodiment may use the silicon carbide substrate 1 which has the (000-1) plane as the main surface in the process for manufacturing the silicon carbide semiconductor device according to the first embodiment.

The embodiments of the invention have been described in detail above. However, the invention is not limited to the above-described embodiments. Various designs can be changed as long as they do not depart from the scope and spirit of the invention. In addition, the embodiments of the invention have been described with reference to the cross-sectional view in which a uniform electrode is formed on the entire surface of the substrate. However, the invention can also be applied to a silicon carbide semiconductor device in which the electrode is partially formed on the main surface of the substrate, for example, a contact of a merged PiN and Schottky barrier (MPS) diode. In each of the embodiments, the first conductivity type is an n type and the second conductivity type is a p type. However, in the invention, the first conductivity type may be a p type and the second conductivity type may be an n type. In this case, the same effect as described above is obtained.

Explanations Of Letters Or Numerals

1 FIRST-CONDUCTIVITY-TYPE SILICON CARBIDE SUBSTRATE;
2 FIRST-CONDUCTIVITY-TYPE SILICON CARBIDE EPITAXIAL LAYER;
3 SECOND-CONDUCTIVITY-TYPE IMPURITY ION IMPLANTATION REGION (JBS);
4 SECOND-CONDUCTIVITY-TYPE IMPURITY ION IMPLANTATION REGION (TERMINATION);
5 SECOND-CONDUCTIVITY-TYPE IMPURITY ION IMPLANTATION REGION (JTE);
6 INTERLAYER INSULATING FILM;
7 FIRST METAL LAYER FORMED ON OTHER MAIN SURFACE;
8 FIRST METAL LAYER AFTER HEAT TREATMENT;
9 OHMIC JUNCTION;
10 LAYER MADE OF MATERIAL WITH HIGH ADHESION TO OTHER METAL;
11 FIRST METAL LAYER (METAL FOR SCHOTTKY JUNCTION);
12 SECOND METAL LAYER (ELECTRODE PAD);
13 POLYIMIDE;
14 SECOND METAL LAYER FORMED ON OTHER MAIN SURFACE;
15 Ti LAYER;
16 Ni LAYER; and
17 Au LAYER.

It is understood that various other modifications will be apparent to and can be readily made by those skilled in the art without departing from the scope and spirit of the present invention. Accordingly, it is not intended that the scope of the claims appended hereto be limited to the description set forth above but rather that the claims be construed as encompassing all of the features of patentable novelty which reside in the present invention, including all features which would be treated as equivalents thereof by those skilled in the art to which the invention pertains.

What is claimed is:
1. A silicon carbide semiconductor device, comprising:
a silicon carbide semiconductor substrate including:
a first region that has a structure in which a first-conductivity-type region is provided or a structure in which the first-conductivity-type region and a second-conductivity-type region are periodically provided;

a second region which surrounds the first region and in which a second-conductivity-type region is provided;
a third region which surrounds the second region and in which a second-conductivity-type region having a different impurity concentration from the second-conductivity-type region of the second region is provided; and
an interlayer insulating film which is formed on the second region and the third region;
a first metal layer that covers at least the first region and that is a film including at least one of a titanium film, a titanium alloy film, a nickel film, a nickel alloy film, or a nickel-titanium alloy film; and
a second metal layer that is formed on the first metal layer and that is an aluminum film or an aluminum alloy film, wherein the first and second metal layers are formed on the silicon carbide semiconductor substrate, and
wherein dry etching is performed on a portion of the second metal layer and the second metal layer covers the entire first metal layer.

2. The silicon carbide semiconductor device according to claim 1, wherein the first metal layer has a thickness of 20 nm to 200 nm.

3. The silicon carbide semiconductor device according to claim 1, wherein the first metal layer and the second metal layer have respective outer circumferential ends, and the outer circumferential end of the first metal layer and the outer circumferential end of the second metal layer are both provided in the second region.

4. The silicon carbide semiconductor device according to claim 1, wherein the first region and the first metal layer have an interface there between that forms a Schottky contact.

5. A silicon carbide semiconductor device, comprising:
a silicon carbide semiconductor substrate including:
a first region that has a structure in which a first-conductivity-type region is provided or a structure in which the first-conductivity-type region and a second-conductivity-type region are periodically provided;
a second region which surrounds the first region and in which a second-conductivity-type region is provided;
a third region which surrounds the second region and in which a second-conductivity-type region having a different impurity concentration from the second-conductivity-type region of the second region is provided; and
an interlayer insulating film which is formed on the second region and the third region;
a first metal layer that covers at least the first region; and
a second metal layer that is formed on the first metal layer, wherein the first and second metal layers are formed on the silicon carbide semiconductor substrate,
wherein the first metal layer and the second metal layer have respective outer circumferential ends, and the outer circumferential end of the first metal layer and the outer circumferential end of the second metal layer are both provided in the second region, and
wherein dry etching is performed on a portion of the second metal layer and the second metal layer covers the entire first metal layer.

6. The silicon carbide semiconductor device according to claim 5, wherein the first metal layer is a film including at least one of a titanium film, a titanium alloy film, a nickel film, a nickel alloy film, or a nickel-titanium alloy film, and wherein the second metal layer is an aluminum film or an aluminum alloy film.

7. The silicon carbide semiconductor device according to claim 5, wherein the first metal layer has a thickness of 20 nm to 200 nm.

8. The silicon carbide semiconductor device according to claim 5, wherein the first region and the first metal layer have an interface there between that forms a Schottky contact.

9. A silicon carbide semiconductor device, comprising:
a silicon carbide semiconductor substrate including:
a first region that has a structure in which a first-conductivity-type region is provided or a structure in which the first-conductivity-type region and a second-conductivity-type region are periodically provided;
a second region which surrounds the first region and in which a second-conductivity-type region is provided;
a third region which surrounds the second region and in which a second-conductivity-type region having a different impurity concentration from the second-conductivity-type region of the second region is provided; and
an interlayer insulating film which is formed on the second region and the third region;
a first metal layer that covers at least the first region; and
a second metal layer that is formed on the first metal layer, wherein the first and second metal layers are formed on the silicon carbide semiconductor substrate and have an interface there between that forms a Schottky contact, and
wherein dry etching is performed on a portion of the second metal layer and the second metal layer covers the entire first metal layer..

10. The silicon carbide semiconductor device according to claim 9, wherein the first metal layer is a film including at least one of a titanium film, a titanium alloy film, a nickel film, a nickel alloy film, or a nickel-titanium alloy film, and wherein the second metal layer is an aluminum film or an aluminum alloy film.

11. The silicon carbide semiconductor device according to claim 9, wherein the first metal layer has a thickness of 20 nm to 200 nm.

12. The silicon carbide semiconductor device according to claim 9, wherein the first metal layer and the second metal layer have respective outer circumferential ends, and the outer circumferential end of the first metal layer and the outer circumferential end of the second metal layer are both provided in the second region.

* * * * *